United States Patent [19]
Takiar et al.

[11] Patent Number: 5,832,585
[45] Date of Patent: Nov. 10, 1998

[54] METHOD OF SEPARATING MICRO-DEVICES FORMED ON A SUBSTRATE

[75] Inventors: Hem Takiar, Fremont; Ranjan Mathew, San Jose, both of Calif.

[73] Assignee: National Semiconductor Corporation, Santa Clara, Calif.

[21] Appl. No.: 696,275

[22] Filed: Aug. 13, 1996

[51] Int. Cl.⁶ .............................. B23P 17/00; H01L 21/78
[52] U.S. Cl. .............................. 29/424; 29/412; 438/114; 438/465; 125/16.02; 451/53
[58] Field of Search ..................... 29/412, 424; 438/33, 438/113, 114, 460, 464, 465; 125/16.02, 12, 21; 451/53, 449, 450

[56] References Cited

U.S. PATENT DOCUMENTS

| | | | |
|---|---|---|---|
| 2,818,696 | 1/1958 | Pigott ........................................ | 451/53 |
| 2,851,764 | 9/1958 | White .................................. | 451/449 X |
| 3,699,644 | 10/1972 | Cocca . | |
| 4,016,855 | 4/1977 | Mimata ................................. | 451/53 X |
| 4,612,211 | 9/1986 | Hawrylo et al. . | |
| 5,306,370 | 4/1994 | Herko et al. ............................ | 156/155 |
| 5,362,681 | 11/1994 | Roberts et al. ......................... | 438/464 |
| 5,393,706 | 2/1995 | Mignardi et al. . | |
| 5,461,008 | 10/1995 | Sutherland et al. ..................... | 437/226 |
| 5,516,728 | 5/1996 | Degani et al. . | |
| 5,593,926 | 1/1997 | Fujihara .............................. | 438/465 X |
| 5,622,900 | 4/1997 | Smith ...................................... | 438/464 |

*Primary Examiner*—S. Thomas Hughes
*Attorney, Agent, or Firm*—Beyer & Weaver, LLP

[57] ABSTRACT

A method of separating a plurality of micro-devices from one another which are formed in a predetermined pattern on a single substrate is disclosed herein. Each micro-device includes at least one predetermined area to be protected from process debris during the separating process. The method includes the step of first coating the micro-devices with a water soluble material such that at least the predetermined area is covered. Following coating, the micro-devices are separated from one another such that the water soluble material continues to cover the predetermined area. Next, the micro-devices and the water soluble material are exposed to water which substantially removes the water soluble material from the predetermined area without harming the micro-devices such that contamination of the predetermined area by the process debris is prevented during the separating step.

12 Claims, 2 Drawing Sheets

METHOD OF SEPARATING MICRO-DEVICES FORMED ON A SUBSTRATE

BACKGROUND OF THE INVENTION

The present invention relates generally to the field of separating a plurality of micro-devices or similar such devices from one another when the devices are formed on a single substrate and more particularly to a method of separating the plurality of micro-devices from one another in the case where each micro-device includes at least one predetermined area to be protected from process debris during the separating process.

In the field of integrated circuits, the use of micro-devices has become increasingly popular. Prominence of these devices is due, at least in part, to the relatively small footprint which these devices occupy within an overall electronic assembly coupled with a high degree of functionality, as compared with conventional approaches. Thus, the use of micro-devices has significantly advanced the continuing goal of miniaturization of electronic assemblies.

While there is no limit to the variety of micro-devices which may ultimately be available, one currently popular form of micro-device is the transducer. Well known forms of transducers which are currently available as micro-devices include, for example, microphones and pressure sensors. These devices generally require exposure of a pressure sensitive diaphragm to the ambient environmental surroundings of the transducer. Since the pressure sensitive diaphragm is relatively fragile, it is normally positioned within the transducer in a manner which protects the diaphragm from damage such as might be caused, for instance, by the diaphragm sustaining an impact. However, in order to generate an output signal, the diaphragm must also be in communication with sound waves and/or pressure changes in the ambient environment. This dual role of protecting the diaphragm while at the same time maintaining communication of the diaphragm with its ambient environment is typically fulfilled by a bridge structure or other such protective member. The bridge structure normally is supported on a peripheral area adjacent the diaphragm and spans the width of the diaphragm being spaced therefrom. A perforated area of the bridge structure which opposes the diaphragm defines a number of openings which facilitate exposure of the diaphragm to ambient sound waves or pressure changes whereby to generate the desired output signal. As will be seen hereinafter, such openings are problematic in traditional integrated circuit separation techniques.

As is typical in the manufacture of integrated circuits, micro-devices may be formed in an array on a silicon substrate or wafer. Once the devices are formed, they must be singulated, that is, separated from one another. Separation of the devices is normally accomplished using diamond coated saw blades which are well known in the art. The sawing process generally produces a considerable amount of dust and/or debris. In the past, integrated circuit dies being produced were not damaged by this debris and the latter was simply washed off of the dies after completion of the sawing process. With the advent of the micro-device, however, this separation process has introduced a particular problem. Specifically, the dust and debris produced by the saw blade or blades tends to clog or become lodged in the openings defined by the micro-device in a manner which may impede proper functioning of the micro-device. The present invention provides an uncomplicated and reliable technique for protecting process debris sensitive micro-devices or similar such devices from process debris.

SUMMARY OF THE INVENTION

As will be described in more detail hereinafter, there is disclosed herein a method of separating a plurality of micro-devices from one another which are formed in a predetermined pattern on a single substrate, each micro-device including at least one predetermined area to be protected from process debris during the separating process. The method includes the step of first coating the micro-devices with a water soluble material such that at least the predetermined area is covered. Following coating, the micro-devices are separated from one another such that the water soluble material continues to cover at least the predetermined area. Next, the micro-devices and the water soluble material thereon are exposed to water which substantially removes the water soluble material from the predetermined area without harming the micro-devices such that contamination of the predetermined area by the process debris is prevented during the separating step.

BRIEF DESCRIPTION OF THE DRAWINGS

The present invention may be understood by reference to the following detailed description taken in conjunction with the drawings, in which.

DETAILED DESCRIPTION OF THE INVENTION

Figure 1:
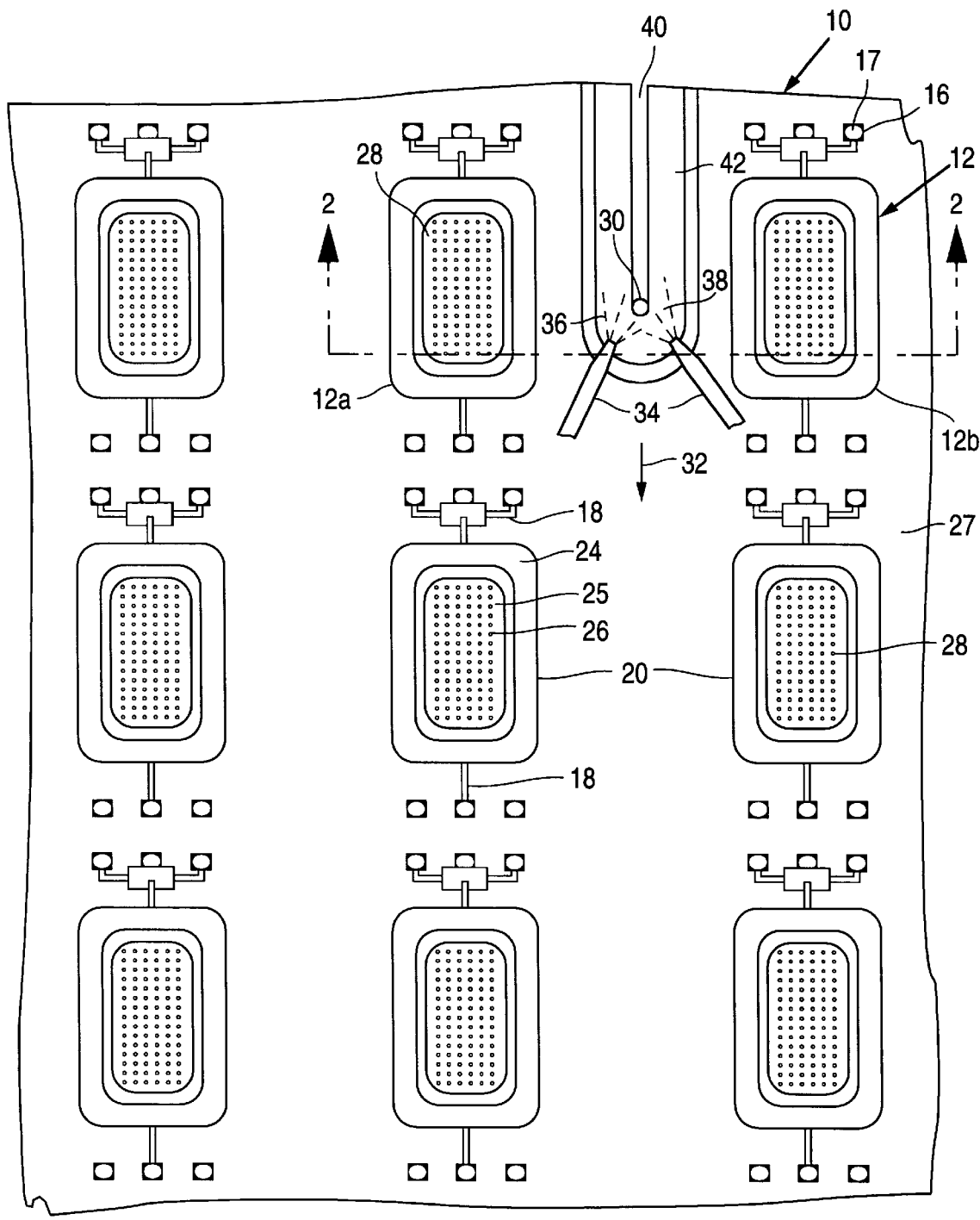
FIG. 1 is a diagrammatic fragmentary plan view generally illustrating a substrate having a plurality of micro-devices formed thereon being treated using the separation process of the present invention.

Attention is immediately directed to FIG. 1 which illustrates a substrate 10 undergoing a separation process in accordance with the method of the present invention. Substrate 10 has formed thereon a plurality of micro-devices each of which comprises a condenser type microphone 12. It is to be understood that the exemplary use of microphones 12 is not intended as limiting and that these microphones are representative of a wide range of micro-devices which are useful within the framework of the teachings of the present invention, provided only that the device includes at least one area which requires protection during the overall separation process to be described hereinafter.

Figure 2:
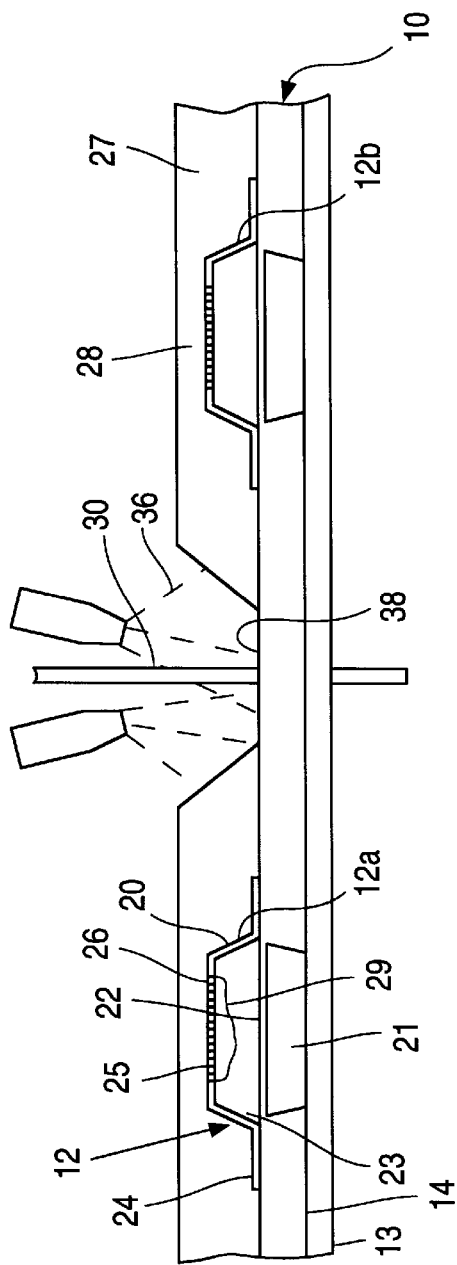
FIG. 2 is a diagrammatic cross-sectional view, in elevation, of the substrate of FIG. 1 illustrating further details of the separation process of the present invention.

Referring to FIG. 2 in conjunction with FIG. 1, substrate 10 is mounted on a backing 13 which serves to seal a lower surface 14 of the substrate. Backing 13 may be formed from suitable materials such as, for example, mylar which are well known in the art. Each microphone 12 includes an arrangement of bonding pads 16 with a conductive bump 17 formed on each respective bonding pad, as illustrated in FIG. 1. An arrangement of electrically conductive traces 18 interconnects bonding pads 16 with other internal components of the microphone which are not shown for purposes of simplicity. Each microphone further includes a bridge structure 20 which covers a thin silicon diaphragm 22. At lower surface 14 of substrate 10, a micro-machined aperture 21 is used in forming each respective diaphragm 22. In sealing lower surface 14, backing 13 also seals apertures 21. It is mentioned that diaphragm 22 is quite fragile by nature. Therefore, the bridge structure protects the diaphragm from sustaining a damaging impact. However, diaphragm 22 is susceptible to other forms of damage. For example, variations in environmental conditions such as temperature can also damage the diaphragm. Such damage includes warping or stressing the diaphragm. Bridge structure 20 includes a peripheral edge portion 24 which is attached to substrate 10 in a well known manner that may include adhesives or solder (neither of which is shown). Diaphragm 22 in cooperation with bridge structure 20 define a cavity 23. A portion 25 of bridge structure 20, which is directly opposed to diaphragm 22, defines an array of openings 26. In operation, openings 26 permit sound waves and/or pressure changes in the ambient surroundings of the microphone to impinge upon diaphragm 22 so as to produce a corresponding output signal. Openings 26 may include a variety of shapes and sizes, however, the openings are typically quite small, on the order of, for example, 10 µm in diameter in the case of circular openings. Thus, these openings are readily clogged by small particles or debris. As described above, clogging should be avoided since the functionality of microphone 12 may be impaired in direct proportion to the number of openings which are clogged.

Continuing to refer to FIGS. 1 and 2 and in accordance with the method of the present invention, substrate 10 including microphones 12 is coated with an overall masking layer 27 (best seen in FIG. 2) of water soluble masking material such that the microphones are embedded in the layer and openings 26 are sealed against the ambient environment by a sealing portion 28 of masking layer 27. One material which has been found to be useful in forming layer 27 is available from Tech Spray, Amarillo, Tex., under the trade number "WS-2210" and comprises a relatively transparent, acrylic based coating material that is soluble in water and is cured using ultraviolet (UV) light. The transparency of layer 27 serves to facilitate proper indexing of the substrate during subsequent steps of the separation process, since the microphones are visible through the layer. It is anticipated that a portion 29 of sealing portion 28 may actually pass through openings 26 of the microphone bridge structures, as illustrated in FIG. 2, dependent upon the viscosity of the material and the size of openings 26. However, portion 29 will not damage the microphone including diaphragm 22 in any way. In fact, cavity 23 may be completely filled (not shown) with the masking material without harming the microphone. Masking layer 27 may penetrate other areas on substrate 10, as well. However, this material is readily removed in a subsequent step of the method and, in some cases, this material may advantageously protect the areas onto which they are deposited from process contamination. In the instance where cavity 23 is completely filled, precautions should be taken to insure that all of portion 29 is removed following the cutting process to be described immediately hereinafter.

Following application of layer 27, the latter is cured using UV light in a well known manner at a low temperature. As noted previously, diaphragm 22 may be damaged by stresses caused by high temperatures. Therefore, material 27 is advantageous in that the low temperature UV cure is used. Thereafter, a cutting process begins wherein a blade 30, which is typically diamond coated, is used to cut through the substrate at appropriate points between the microphones formed thereon. Any number of prior art saws intended for cutting wafers are adaptable for use within the present method as will be described in further detail at an appropriate point below. For purposes of simplicity, the present illustrations show only one blade. However, it should be appreciated that these saws may utilize any number of blades. It is noted that blade 30 appears in the plan view of FIG. 1 as a circle since this exemplary blade comprises a diamond coated wire.

As the cutting step is performed, substrate 10 and blade 30 are moved relative to one another such that the substrate engages the blade in the direction indicated by arrow 32 so as to progressively cut through the substrate. Typically the substrate is moved while the blade maintains a stationary position, however, movement of the blade with the substrate held stationary or simultaneous movement of both the blade and substrate are viable alternatives. During this movement, a pair of high velocity water jets 34 emit water 36 which is directed at an area 38 immediately ahead of blade 30 such that water soluble layer 27 is substantially washed away from the surface of substrate 10 in area 38 prior to cutting of the substrate. In this way, masking layer 27 does not clog or otherwise gum up blade 30 during cutting. While two water jets 34 are illustrated in the present example, it should be appreciated that any number of these jets may be used in accordance with the present invention. It is mentioned that small amounts of material 27 remaining in area 38 will not adversely affect the cutting process in view of the cooling effect of water 36. In addition to providing cooling, water 36 also acts as a lubricant between blade 30 and the substrate. As cutting proceeds, a slot 40 is formed in the substrate between micro-devices 12a and 12b within a channel 42 in which masking layer 27 has been progressively removed by the action of water 36. It should be mentioned that the amount of water soluble material layer 27 which is removed in areas other than channel 42 is significant in that portions 28 of layer 27 which seal openings 26 of the respective microphones should not be removed to an extent which might compromise the sealing of openings 26. Moreover, partial removal of sealing portion 28 may be unavoidable since these areas may be exposed to water which is not contained by channel 42. Cutting of the substrate proceeds in the manner described above until such time that all of the microphones are separated from one another.

Figure 3:
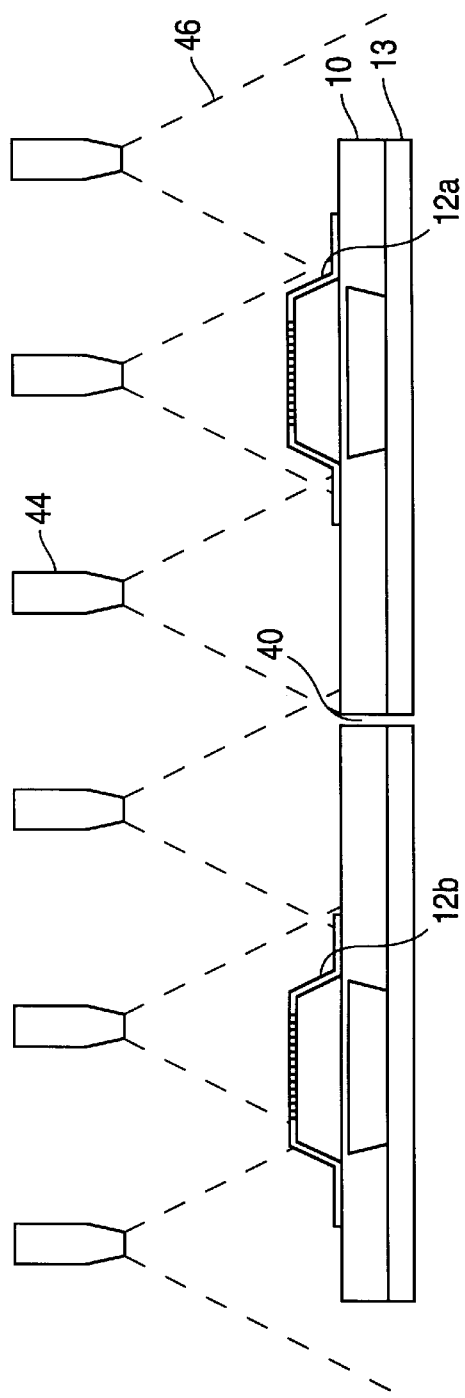
FIG. 3 is a diagrammatic cross-sectional view, in elevation, of micro-devices separated from the substrate of FIG. 2 undergoing a final wash step.

Turning now to FIG. 3 and following the cutting step, microphones 12 are exposed to a final water wash at which time the remaining portions of layer 27 including sealing portions 28 and portions 29, if present, are removed. This exposure may be performed, for example, using additional water jets 44 which spray water 46 onto the substrate. Thus, openings 26 are unsealed and, in accordance with the present invention, the areas in which these openings are defined and the openings themselves have been protected from process debris throughout the separation process. It is mentioned that this final wash step may simply comprise an extension of the final wash step which some prior art equipment is presently configured to perform. Alternative to the jet wash illustrated by FIG. 3, the final washing step may be performed in any number of ways provided that complete dissolution of the water soluble masking layer is attained, including the use of heated or hot water, such that openings 26 along with any other critical areas of the substrate are free of masking material.

It is to be understood that, while water soluble masking material is preferred herein, the method of the present invention contemplates the use of materials as layer 27 which are not water soluble. These materials, while certainly not preferred, as just stated, and less advantageous, are useful so long as solvents utilized in their removal are compatible with the materials present on the substrate used in forming the devices thereon. One example of an alternative material/solvent combination may include, for example, hardened sucrose/fructose films and water, respectively.

Sucrose or fructose films could be created by dispensing saturated azeotropic mixtures of sucrose, water and appropriate evaporable carriers such as, for example, isopropyl alcohol on a high speed wafer spin track.

Advantages attendant to the use of water soluble masking layer include eliminating the need for special waste treatment procedures and/or equipment, as previously mentioned, and general compatibility with other process steps, in addition to the final wash step described above. For example, following the final wash, a drying step is normally performed. Because material 27 is water soluble, the drying step may be carried forth with little or no modification to existing procedures and equipment since drying water from the separated micro-devices does not generally emit problematic vapors. In contrast, some solvents such as, for example, acetone which may alternatively be used with a masking layer formed from PGMEA (propylene glycol monomethyl ether acetate) based photoresist requires stringent control of vapor emissions during the drying step.

It should be understood that the present invention may be embodied in many other specific forms without departing from the spirit or scope of the invention. For example, a non-water soluble masking material may be used or the masking material may be applied solely to those areas which require its protection. Therefore, the present examples and methods are considered as illustrative and not restrictive, and the invention is not to be limited to the details given herein, but may be modified within the scope of the appended claims.

What is claimed is:

1. A method of separating a plurality of micro-devices which are formed in a predetermined pattern on a single substrate, each micro-device including a predetermined area to be protected from process debris during the separating process, the method comprising the steps of:

coating the micro-devices with a water soluble material such that at least the predetermined areas are covered;

dicing the substrate using a saw having a blade which creates said process debris to separate the micro-devices from one another such that the water soluble material continues to cover the predetermined areas during dicing;

exposing the blade and an area of the water soluble material immediately ahead of the blade to water prior to and during cutting of the substrate in a manner that substantially removes the water soluble material from the area immediately ahead of the blade prior to the blade passing therethrough, so as to prevent the water soluble material from clogging or otherwise gumming up the blade; and exposing the micro-devices and the water soluble material thereon to water which substantially removes the water soluble material from the predetermined areas without harming the micro-devices such that contamination of the predetermined areas by the process debris is prevented during the dicing step.

2. A method according to claim 1 wherein said micro-devices are coated with a layer of said water soluble material to a depth which substantially embeds the micro-devices within the layer.

3. A method according to claim 1 including the step of curing said water soluble material after it is applied to the micro-devices, but before separating the devices from one another.

4. A method according to claim 3 wherein said water soluble material is cured using ultraviolet light.

5. A method according to claim 3 wherein said water soluble material is cured at a temperature which avoids damaging said micro-devices.

6. A method according to claim 1 wherein said water soluble material is sufficiently transparent such that the underlying micro-devices remain visible after the coating step.

7. A method according to claim 1 wherein said area immediately ahead of the blade is exposed to at least one high velocity water jet.

8. A method according to claim 1 wherein each said micro-device defines at least one opening in said predetermined area and wherein said coating blocks said openings during said dicing step such that the openings are not contaminated by said process debris.

9. A method of separating a plurality of micro-devices which are formed in a predetermined pattern on a single substrate, each micro-device defining at least one opening to be protected from process debris during the separating process, said method comprising the steps of:

a) embedding said micro-devices in a layer of water soluble material such that at least said openings are sealed and so that the underlying micro-devices remain sufficiently visible through the layer;

b) curing said water soluble material layer at a temperature which does not damage the micro-devices;

c) separating the micro-devices from one another by cutting said substrate using a saw blade which creates said process debris such that the water soluble material does not clog the saw blade and said water soluble material layer continues to seal said openings against said process debris wherein the blade and an area of the water soluble material immediately ahead of the blade are exposed to water prior to and during cutting of the substrate in a manner that substantially removes the water soluble material from the area immediately ahead of said blade prior to the blade passing therethrough, so as to prevent the water soluble material from clogging or otherwise gumming up the blade; and d) exposing the micro-devices and the masking material thereon to water which substantially removes the water soluble material from said openings without harming the micro-devices such that contamination of the openings by said process debris is prevented during the separating step.

10. A method according to claim 9 wherein said area immediately ahead of said blade is exposed to at least one high velocity water jet.

11. A method as recited in claim 9 wherein the micro-devices are transducers.

12. A method as recited in claim 9 wherein the micro-devices are condenser type microphones.

* * * * *